(12) United States Patent
Litwin et al.

(10) Patent No.: US 6,514,799 B2
(45) Date of Patent: Feb. 4, 2003

(54) METHOD FOR SUBSTRATE NOISE DISTRIBUTION

(75) Inventors: Andrej Litwin, Danderyd (SE); Johan Sjöström, Tyresö (SE); Anders Dunkars, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 52 days.

(21) Appl. No.: 09/852,785

(22) Filed: May 11, 2001

(65) Prior Publication Data

US 2002/0025610 A1 Feb. 28, 2002

(30) Foreign Application Priority Data

May 12, 2000 (SE) .............................................. 0001791

(51) Int. Cl.[7] .............................................. H01L 21/70
(52) U.S. Cl. ...................................................... 438/129
(58) Field of Search ................................. 438/129, 128; 257/379, 401, 528, 499

(56) References Cited

U.S. PATENT DOCUMENTS

| | | | |
|---|---|---|---|
| 5,084,744 A | | 1/1992 | Hori et al. |
| 5,323,043 A | | 6/1994 | Kimura et al. |
| 5,756,387 A | * | 5/1998 | Villa et al. .................. 257/469 |
| 5,973,952 A | | 10/1999 | Crafts |
| 6,232,645 B1 | * | 5/2001 | Belot ......................... 257/516 |
| 2002/0089812 A1 | * | 7/2002 | Anthony et al. .......... 361/321.2 |

OTHER PUBLICATIONS

Sheng, et al. "A Low–Power CMOS Chipset for Spread–Spectrum Communications", Solid State Circuits Conference, 1996. Digest of Technical Papers, 42nd ISSCC., 1996 IEEE International, Feb. 8–10, 1996, pp–346–347, 471.

Merrill, et al. "Effect of Substrate Material on Crosstalk in Mixed Analog/Digital Integrated Circuits", Electron Devices Meeting, 1994. Technical Digest, International, Dec. 11–14, 1994, pp. 433–436.

* cited by examiner

*Primary Examiner*—Michael Sherry
*Assistant Examiner*—Evan Pert
(74) *Attorney, Agent, or Firm*—Burns, Doane, Swecker & Mathis, L.L.P.

(57) ABSTRACT

A method is disclosed for noise distribution in high resistivity substrates containing differential or balanced integrated circuitry obtaining a noise suppression by an introduction of noise distributors. Noise from an external noise source (5) is made isotropic in relation to branches of a differential or balanced integrated circuitry by creating a low resistivity path adjacent to the differential or balanced integrated circuitry typically formed by two integrated transistors (A, B) or group of transistors. The low resistivity path in the general case is made symmetrical in relation to the integrated transistors thereby forming a noise distributor for distributing the noise evenly. The noise distributor then is formed as a floating substrate contact (10) of the same doping kind as a substrate or a well within which the differential or balanced circuitry is contained. Furthermore the shape of the noise distributor will be optimized by simulations of the structure of the noise distributing low resistivity path, which structure does not need to be continuous as long as the low resistivity path is maintained.

7 Claims, 3 Drawing Sheets

METHOD FOR SUBSTRATE NOISE DISTRIBUTION

TECHNICAL FIELD

The present invention relates to a method for integrated circuit substrate noise distribution and more particularly to noise distribution in noise sensitive differential or balanced integrated circuits.

BACKGROUND

The integration trend in design of digital radio for mobile telephony is to combine as many functions as possible into a single monolithic integrated circuit (IC). Digital portions and A/D and/or D/A converters are mainly designed by means of CMOS or BiCMOS processes. However, also analogue RF portions can be realized using the same technology as, for instance, described by S. Sheng et al. in a document titled "A Low-Power CMOS Chipset for Spread-Spectrum Communications" (International Solid-State Circuits Conference, 1996).

This demand for higher levels of integration is leading to the implementation of high-resolution analogue circuits within the same substrate as large digital systems produced by Very Large Scale Integration (VLSI). In such mixed-signal systems, the coupling of digital switching noise into sensitive analogue circuits can significantly limit the performance achieved in analogue signal processing and data conversion circuits. There is a significant dependence of the noise coupling through the substrate on the constitution of the silicon substrate. For instance this has been discussed by R. B. Merrill, W. M. Young, K. Brehmer in a paper titled "Effect of Substrate Material on Crosstalk in Mixed Analog/Digital Integrated Circuits" (IEDM Tech. Dig. 1994, pp. 433–436).

The addition of AC grounded guard rings around the substrate noise generating and/or the noise sensitive circuits decrease the noise signal amplitude. The similar effect is achieved by the addition of pn-junctions to isolate the NMOS transistors from the substrate by e.g. adding an n-type buried layer under the p-well of NMOS transistor or an extra deep n-well surrounding the p-well, improves significantly the noise isolation by introducing junction capacitances between the transistors and the substrate as for instance demonstrated by U.S. Pat. No. 5,323,043. However, such techniques of pn isolation can't be used for circuits containing bipolar transistors or for CMOS processes without these options. The use of guard rings is thus a main option to reduce the noise. Studying the noise sensitive differential circuits with grounded guard rings on different silicon substrates, i.e. low and high resistivity, it was realized that guard rings are inefficient for significant reduction of the noise amplitude on circuits made on low resistivity substrates. The reason is that the noise spreads efficiently in the substrates under the studied circuits. However, the difference in noise amplitude between the two differential inputs will be much lower than in the circuits using high resistivity substrates, even if in the last case the absolute value of the noise amplitude is much lower at each input terminal.

SUMMARY

A method for noise distribution in noise sensitive differential or balanced Integrated Circuits is disclosed. Noise from an external noise source is made isotropic in relation to branches of a differential or balanced integrated circuitry by creating a low resistivity material path adjacent to at least two integrated transistors forming the differential or balanced integrated circuitry. The path of the low resistivity material is preferably made symmetrical in relation to the integrated transistors thereby forming a noise distributor for distributing the noise evenly. The noise distributor is formed as a floating substrate contact of the same doping kind as a substrate or a well within which the differential or balanced circuitry is contained. Furthermore the shape of the noise distributor will be optimized by simulations of the structure of the noise distributing low resistivity path, which structure does not need to be continuous as long as the low resistivity path is maintained.

A method according to the present invention is set forth by the independent claim 1 and further embodiments are set forth by the dependent claims 2 to 7.

BRIEF DESCRIPTION OF THE DRAWINGS

The invention, together with further objects and advantages thereof, may best be understood by making reference to the following description taken together with the accompanying drawings, in which.

DESCRIPTION

Unexpectedly it was realized that for differential or balanced integrated circuits it is of great importance not only to reduce the noise amplitude but also to have the noise coming from random directions coupled equivalently to both branches of the balanced/differential circuit. The use of a high resistivity substrate, necessary from other reasons, will create a substantial resistance in the substrate between the similar nodes of the two branches. This resistance will cause the attenuation of the noise signal at the far end of the resistance and the subsequent signal mismatch in the circuits of both branches. A way to improve the mismatch is to create a low resistivity path 10 around the circuit consisting of at least of two transistors, A and B, thereby to distribute the noise evenly, i.e. to make the external noise source isotropic in relation to the circuit. Such a device may consist of a substrate contact 10 of the same doping kind as the substrate or the well within which the circuit is contained and which will assume the local potential of the substrate. This substrate contact does not have to form a continuous path but may be divided into several structural paths. However, the structure of the device needs to be symmetrical in respect to the circuit and can be implemented as a square or circle around the circuit, but also as a grid with bars within the circuit or even as a cross. Preferably, a metal layer 12 is put on top of the substrate contact 10 to further lower the resistance, but without any connection to the other nodes of the circuit. The optimization of the shape for best results is preferably tested and confirmed by simple simulations. A tool for such a simulation may be the today available LAYIN simulation package. The structure does not need to be continuos as long as the low resistivity path is maintained, meaning that it can be acceptable to have voids in the contact layer and metal layer, also only a single one coincidental. However, such a device (referred to as a noise distributor) will only evenly distribute the noise coupling from the other part of the complete IC, but will not attenuate the noise. To further improve the common mode noise immunity of this circuit a grounded guard ring according to the state of the art should preferably be placed around the noise sources to attenuate their signal levels spread.

The structures of the present noise distribution solution are easily fabricated by standard processing steps used in the making of the integrated circuitry containing the differential or balanced input transistors A, B formed in the high resistivity substrate used. FIGS. 4(a) to 4(e) do illustrate some illustrative different shapes for noise distributor devices out of a variety of possible shapes, which may be used alone or in combination for the application of the present invention.

Figure 1:
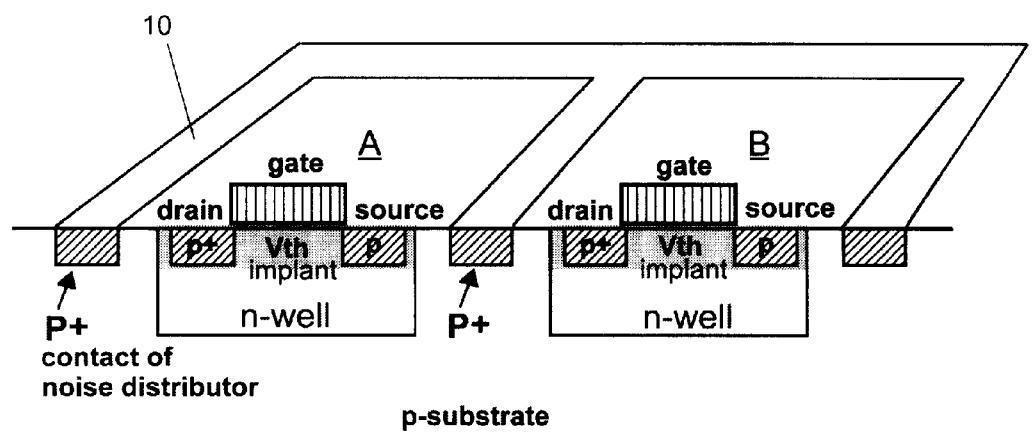
FIG. 1 illustrates a pair of differential transistors in a conventional CMOS process with a starting p-type wafer and a grid $p^+$ noise distributor.
Figure 2:
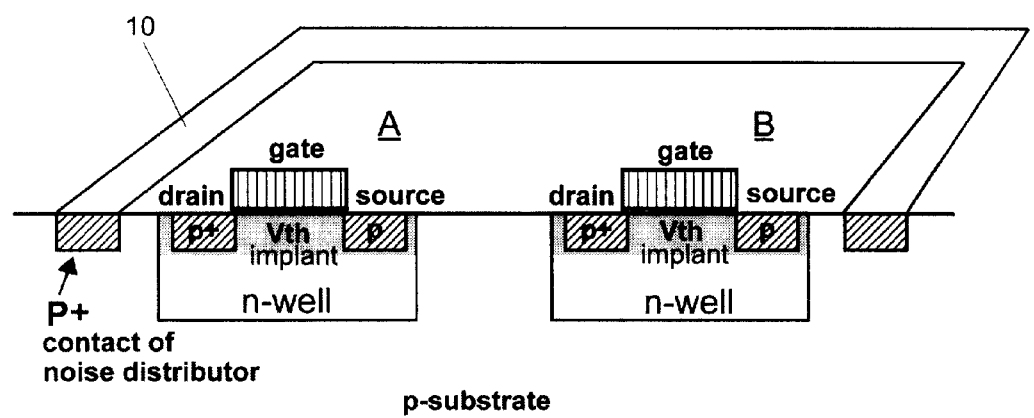
FIG. 2 illustrates a pair of differential transistors in a conventional CMOS process with a starting p-type wafer and a square $p^+$ noise distributor.
Figure 3:
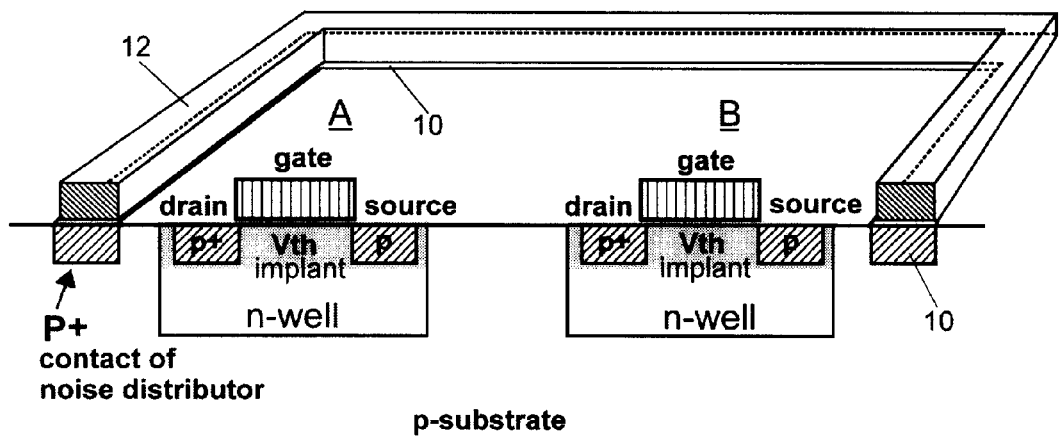
FIG. 3 illustrates a pair of differential transistors in a conventional CMOS process with a starting p-type wafer and a square $p^+$ noise distributor provided with a metallization.
Figure 4:
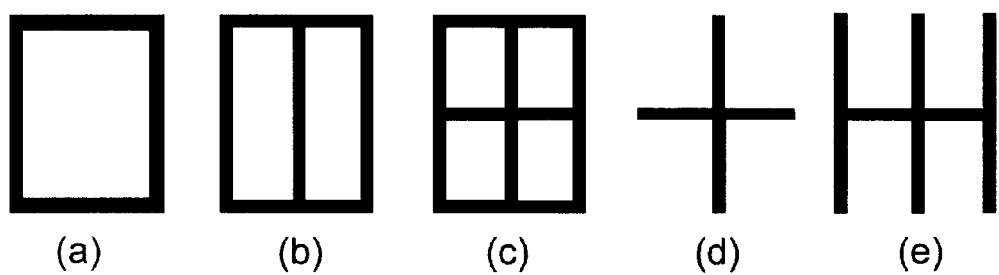
FIGS. 4(*a*) to 4(*e*) illustrates some possible shapes of the noise distributor.
Figure 5:
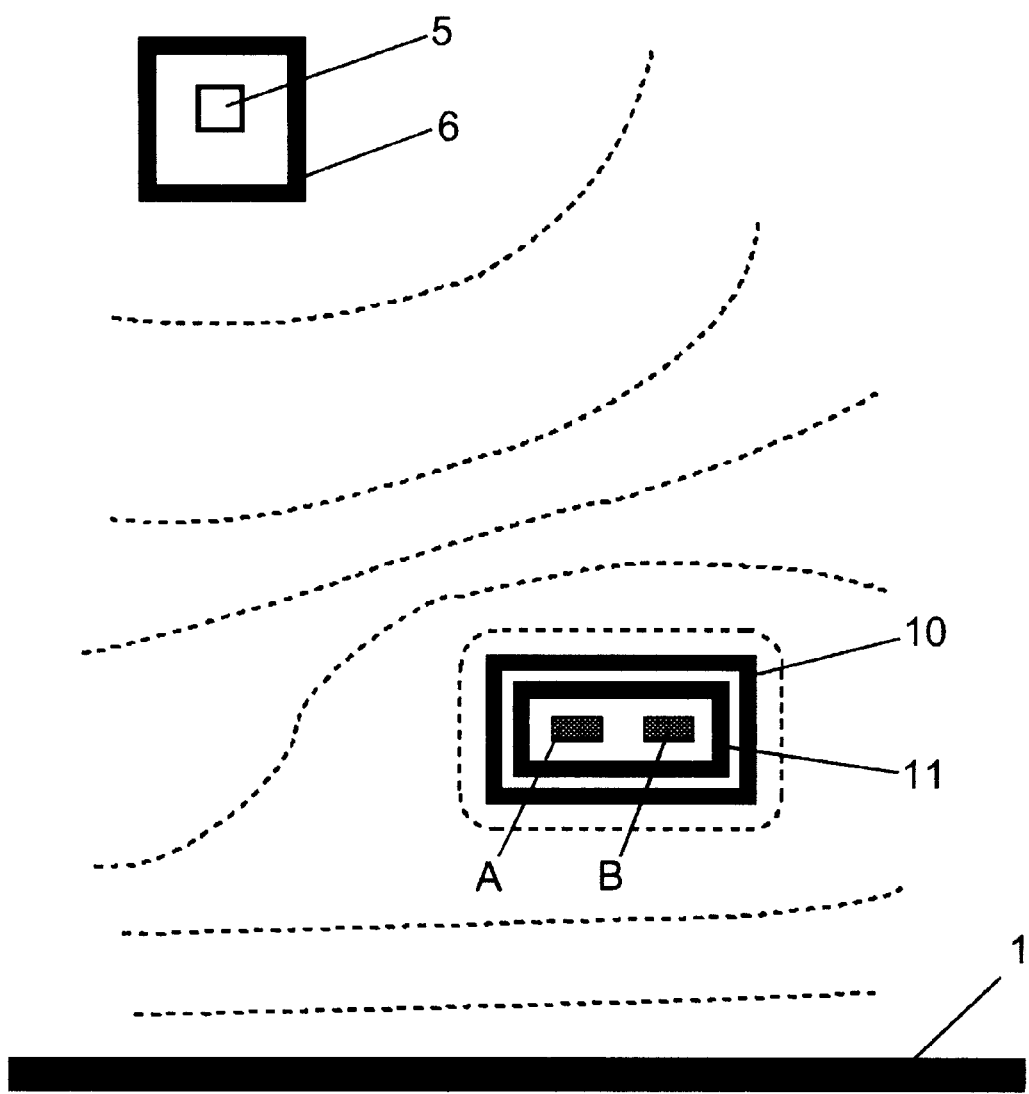
FIG. 5 illustrates a surface potential distribution in a simulation with a guard ring at a noise source and an inner and outer noise distribution device at a pair of input transistors.

FIG. 5 illustrates a simulation setup for a computer simulation of noise pickup by a differential circuitry containing two input transistors A, B sketched and surrounded by an inner 11 and outer 12 noise distribution device according to the present invention, and having an adjacent noise source 5 encompassed by a standard guard ring 6 on a same semiconductor substrate, the guard ring 6 primarily being grounded. Reference number 1 refers to a ground contact (noise sink) of the setup. The dashed lines in FIG. 5 represents a surface potential distribution achieved by a simulation tool LAYIN.

To evaluate the efficiency of different noise distributor/ guard ring configurations illustrated in FIG. 5 on low and high resistivity substrates, a series of computer simulations were performed, producing results presented in Table I for a low resistivity substrate and in Table II for a high resistivity substrate.

A simulation of the differential potential (volts) under the differential transistor pair A, B illustrated in FIG. 5 is demonstrated in Table I below. A state for the noise source guard ring 6, the outer noise distributor 10 and the inner noise distributor 11 of the differential input circuitry respectively is noted in a first column as g=grounded or f=floating:

TABLE I

| | |
|---|---|
| (g, g, g) | $0.0112542 - 0,0115076 = -256.4 \cdot 10^{-6}$ |
| (g, f, f,) | $0.0429572 - 0.0429398 = 17.4 \cdot 10^{-6}$ |
| (g, g, f) | $0.0160983 - 0.0167200 = -621.7 \cdot 10^{-6}$ |
| (g, f, g) | $0.0137810 - 0.0134933 = 287.7 \cdot 10^{-6}$ |
| (f, f, f) | $0.0951863 - 0.0951478 = 38.5 \cdot 10^{-6}$ |
| Without the noise distributors in the layout: | |
| (g, -, -) | $0.0428671 - 0.0428538 = 13.3 \cdot 10^{-6}$ |
| (f, -, -) | $0.0949900 - 0.0949606 = 29.4 \cdot 10^{-6}$ |

With a high resistivity substrate the simulation results are summarized in Table II. The states of the source guard ring, outer noise distributor, and inner noise distributor respectively are noted as g=grounded and f=floating:

TABLE II

| | |
|---|---|
| (g, g, g) | $0.0009837 - 0,0008455 = 138.2 \cdot 10^{-6}$ |
| (g, f, f) | $0.0175996 - 0.0175513 = 48.3 \cdot 10^{-6}$ |
| (g, g, f) | $0.0016645 - 0.0015758 = 88.7 \cdot 10^{-6}$ |
| (g, f, g) | $0.0015779 - 0.0013609 = 217.0 \cdot 10^{-6}$ |
| (f, f, f) | $0.1791145 - 0.1786380 = 476.5 \cdot 10^{-6}$ |
| Without the noise distributors in the layout: | |
| (g, -, -) | $0.0180894 - 0.0178011 = 288.3 \cdot 10^{-6}$ |
| (f, -, -) | $0.1854298 - 0.1825717 = 2858.1 \cdot 10^{-6}$ |

In Table I the substrate is assumed to be a standard low resistivity CMOS substrate with approximately 10 mohmcm and an epitaxial layer on top of it. The results in Table I, where the parenthesis show the status of the shielding and distributing structures respectively refer to FIG. 5, i.e. guard ring 6 around the source and noise distributors 10, 11 around the receiver. Those are either connected to ground, not connected to any potential (floating) or non-existent (taken away from the layout). The first two values in the table show the signal amplitude at the left and the right transistor, A and B respectively, of the receiver according to FIG. 5, and the last value represents the resulting differential signal. The differential signal value is noted with a negative sign when the value in the right column is larger than the value in the left column. It can be seen that having all mentioned structures grounded, as it would be done in a conventional design, the first two values are observed to be lowest, but not the differential signal value achieved. This differential signal value is more than two orders of magnitude higher than if we omit the noise distributors or have them floating and only the guard ring around the source grounded.

The situation is different when we use the high resistivity substrate in the range 0.5–500 ohmcm with the same arrangement as above, which is illustrated in Table II. Even in this case with all mentioned structures grounded, as it would be done in a conventional design, the first two values are the lowest, but the differential value is considerably higher. The differential signal in this case is 3 times lower if we have the noise distributors floating. As can also be seen, omission of noise distributors also gives a much higher differential signal value than when utilizing the proposed inventive noise distributing structures.

The simulations show the best effect of such arrangement on high resistivity substrates, while with a low resistivity substrate there is little difference between using a grounded guard ring at the noise source and floating noise distributors or no noise distributors at all. Thus, with a low resistivity substrate the effect from a grounded standard guard ring according to the state of the art can be considered to suffice if used around the noise sources. However, the use of grounded guard rings around noise sensitive differential circuits will severely degrade their performance.

It is apparent in the case of a high resistivity substrate that the use of the floating inner and outer noise distributors according to the present invention significantly decreases the differentially induced noise at the pair of integrated input transistors. Only a commonly used grounded guard ring for screening can minimise the signal induced to each individual input, but the differentially induced signal will still be considerable. The noise distributors are not screening like a guard ring but do distribute the noise in an equal way to the integrated input transistors resulting in that the induced signal on each individual input still may be large, as clearly seen in Table II, but the differential signal, which is the important quantity, is considerably reduced.

In the case of a low resistivity substrate the use of the floating noise distributors is still superior to grounding both a guard ring and noise distributors, but the result, as already mentioned, is more or less comparable with a case using no such noise distributors in the case of a low resistivity substrate.

It will be apparent to a person skilled in the art that the noise distributing structures according to the invention may be designed and varied to form numerous shapes without departing from the spirit and the scope of the present invention, which is defined by the attached claims.

What is claimed is:

1. A method for noise distribution in high resistivity substrates containing differential or balanced integrated circuitry, comprising the steps of:

making noise from an existing noise source isotropic in relation to branches of the differential or balanced integrated circuitry by creating at least one low resistivity path adjacent to each pair of integrated transistors or group of transistors forming the differential or balanced integrated circuitry, the low resistivity path being symmetrical in relation to said each pair of integrated transistors or group of transistors forming the differential or balanced integrated circuitry thereby forming noise distributors for evenly distributing noise present;

providing noise distributing structure forming a floating substrate contact of the same doping kind as a substrate or a well, within which the differential or balanced circuitry is contained, the noise distributing structure having no connections to nodes of the differential or balanced integrated circuitry and not needing to be continuous as long as a set of noise distributing low resistivity paths are maintained adjacent to each pair of integrated transistors or group of transistors forming the differential or balanced integrated circuitry.

2. The method of claim 1, comprising the further step of forming a floating metallizing layer on top of a floating substrate contact to further lower the resistance of the noise distributing structure.

3. The method of claim 2, comprising a further step of optimizing a shape and position of distributors by computer simulations of structures of the noise distributing low resistivity paths.

4. The method of claim 1, comprising a further step of forming the noise distributing structure as a grid with bars within the differential or balanced circuitry.

5. The method of claim 1, comprising a further step of forming the noise distributing structure in a main form like at least one square or a circle of floating low resistivity paths around the differential or balanced circuitry.

6. The method of claim 1, comprising a further step of improving a common mode noise immunity of the differential or balanced circuit by placing a grounded guard ring around any expected noise sources to further attenuate noise signal induction upon the integrated transistors or group of transistors forming the differential or balanced circuitry.

7. The method of claim 1, comprising a further step of forming the noise distributing structure comprising one or several combinations out of a variety of symmetrical geometrical shapes.

* * * * *